US006498401B2

(12) United States Patent
Yokota

(10) Patent No.: US 6,498,401 B2
(45) Date of Patent: Dec. 24, 2002

(54) ALIGNMENT MARK SET AND METHOD OF MEASURING ALIGNMENT ACCURACY

(75) Inventor: Kazuki Yokota, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/788,759

(22) Filed: Feb. 20, 2001

(65) Prior Publication Data

US 2001/0021548 A1 Sep. 13, 2001

(30) Foreign Application Priority Data

Feb. 21, 2000 (JP) ....................................... 2000-042562

(51) Int. Cl.[7] ................................................ H01L 21/76
(52) U.S. Cl. ........................ 257/797; 438/462; 438/401
(58) Field of Search ......................... 257/797; 438/401; 355/33, 62, 77

(56) References Cited

U.S. PATENT DOCUMENTS 5,262,822 A * 11/1993 Kosugi et al. ................ 355/53
5,654,553 A * 8/1997 Kawakubo et al. ......... 250/548
6,118,128 A * 9/2000 Kojima .................... 250/491.1
6,124,922 A * 9/2000 Sentoku ....................... 355/53

FOREIGN PATENT DOCUMENTS

JP 2-28918 1/1990

* cited by examiner

*Primary Examiner*—David Nelms
*Assistant Examiner*—Thoa P Le
(74) *Attorney, Agent, or Firm*—Scully, Scott, Murphy & Presser

(57) ABSTRACT

An alignment mark set is provided, which facilitates the formation of a desired contour of each alignment mark and which suppresses the degradation of measurement accuracy for alignment of patterns. This alignment mark set comprises: (a) a first alignment mark formed in an exposure area; the area having a periphery, first central axis, and a second central axis perpendicular to the first axis; the first alignment mark being located near the first central axis and apart from the second axis; (b) a second alignment mark formed in the exposure area; the second alignment mark being located near the second central axis and apart from the first axis; and (c) when the exposure areas are regularly arranged in such a way as to have a same orientation in a plane, each of the first and second alignment marks in one of the sets is not located close to the first and second alignment marks in another of the sets, thereby ensuring irradiation of exposing light to all the areas. It is preferred that each of the first and second marks is square.

6 Claims, 11 Drawing Sheets

110
115
107a
d3
119
d4
118
107d
107
d1
d2
d1
d2
113
111
114
119
118
118
119
107b
118
d3
119
d4
Y
X
107c
112

ALIGNMENT MARK SET AND METHOD OF MEASURING ALIGNMENT ACCURACY

BACKGROUND OF THE INVENTION

1. Field of the Invention

The present invention relates to alignment marks and more particularly, to an alignment mark set comprising alignment marks that are formed in an exposure area and used to measure the alignment or overlay accuracy of patterns in the lithographic process for semiconductor device fabrication, and a method of measuring alignment accuracy of patterns using alignment mark sets.

2. Description of the Related Art

Generally, semiconductor devices comprise a lot of layers that form electronic elements, wiring lines, contacts, and so forth, which are stacked to each other along with interlayer dielectric layers. These stacked layers constitute an integrated circuit. Thus, to fabricate semiconductor devices, the stacked layers need to be patterned to form desired electronic elements, wiring lines, and so forth using well-known lithography and etching techniques.

With the lithography and etching techniques, it is very important not only to transfer a desired minute pattern to a specific layer on or over a semiconductor wafer as closely as possible but also to overlay an upper pattern to a lower one as correctly as possible. Thus, in the lithography process, the pattern of a resist layer, which is formed on a layer to be etched or patterned (i.e., a target layer), needs to be aligned on a desired lower pattern located below the target layer with high accuracy. In particular, circuits and elements provided in a recent semiconductor device have been increasingly miniaturized and therefore, the need to raise the overlay accuracy (i.e., alignment accuracy) of patterns has been becoming stronger.

Conventionally, to meet the above-described need, "alignment marks" have been usually formed along with a pattern for desired circuits and/or elements, thereby measuring the alignment accuracy using the alignment marks.

FIGS. 1 and 2 show an example of the conventional alignment marks of this sort, which is formed on a semiconductor substrate or wafer.

The conventional alignment mark 100 shown in FIGS. 1 and 2, which has been usually used for this purpose, comprises two mark elements 118 and 119. The inner element 119 is located in the outer element 118. Each of the elements 118 and 119 is square in plan shape. The mark 100 is formed in the following way.

First, as shown in FIG. 2, a first layer 122 is formed on the surface of a semiconductor substrate or wafer 121 and then, a patterned resist layer (not shown) is formed on the first layer 122. The patterned resist layer is formed by the lithography technique. Then, using the patterned resist layer as a mask, the first layer 122 is selectively etched, thereby forming a first or lower circuit pattern (not shown) and the outer square element 118 of the alignment mark 100 in the layer 122. As clearly seen from FIG. 2, the element 118 is a square hole or opening of the layer 122.

Subsequently, a second layer 123 is formed on the first layer 122 thus patterned so as to contact the bottom and side faces of the outer element 118 (i.e., the hole of the first layer 122). Then, a resist layer (not shown) is formed on the second layer 123 thus formed, and is patterned by the lithography technique, thereby forming a second or upper circuit pattern (not shown) and the inner square element 119 of the alignment mark 100 on the second layer 123 in the hole 118 of the first layer 122.

As clearly seen from FIG. 2, the inner element 119 of the mark 100 is a square part of the resist layer and located in the hole or outer element 118. The patterned resist layer thus formed is used as a mask in the next etching process for patterning the underlying second layer 123.

The alignment mark 110, shown in FIG. 3, comprising the outer and inner elements 118 and 119 thus formed is used to measure the alignment accuracy between the first circuit pattern formed by the first layer 122 and the second circuit pattern of the resist layer. In this case, the relative positional relationship between the outer and inner elements 118 and 119 is measured.

For example, as shown in FIG. 2, the distance d1 between the inner side face 118*a* of the outer element 118 and the facing side face 119*a* of the inner element 119 is measured. At the same time as this, the distance d2 between the opposite inner side face 118*b* of the outer element 118 and the facing side face 119*b* of the inner element 119 is measured. If the values of the distances d1 and d2 are equal, it is judged that the first or lower circuit pattern is overlaid with the second or upper circuit pattern correctly (i.e., with desired alignment accuracy). Sometimes, it is judged whether or not the value of the difference (d1–d2) between the distances d1 and d2 is within a specific range. In any of these cases, no subsequent process is applied unless it is judged that the first or lower circuit pattern is overlaid with the second or upper circuit pattern with desired alignment accuracy.

FIG. 3 shows the layout or arrangement of the conventional alignment marks in an exposure area on a semiconductor wafer. As seen from FIG. 3, four alignment marks 110, 111, 112, and 113 are provided in one of rectangular one-shot exposure areas 107 arranged on a semiconductor wafer 10. Each of the marks 110, 111, 112, and 113 has the same structure as the conventional mark 100 shown in FIGS. 1 and 2. Specifically, each of the marks 110, 111, 112, and 113 comprises the square outer and inner mark elements 118 and 119. The set of the four alignment marks 110, 111, 112, and 113 may be termed the "conventional alignment mark set".

In the rectangular exposure area 107 in FIG. 3, the two marks 110 and 112 are located on the longitudinal, central axis 115 of the area 107, where the direction along the axis 115 is defined as the Y direction. Since the marks 110 and 112 are on the axis 115, they are positioned at the middle of the short sides 107*a* and 107*c* of the area 107. The mark 110 is close to the upper short side 107*a* while the mark 112 is close to the lower short side 107*c*. The other marks 111 and 113 are located on the lateral, central axis 114 of the area 107, where the direction along the axis 114 is defined as the x direction. Since the marks 111 and 113 are on the axis 114, they are positioned at the middle of the long sides 107*b* and 107*d* of the area 107. The mark 111 is close to the right long side 107*b* while the mark 113 is close to the left long side 107*d*. A desired circuit or element pattern (not shown) is typically located among the four marks 110, 111, 112, and 113 in the area 107.

To measure the alignment accuracy along the X direction, the alignment marks 111 and 113 located on the lateral axis 114 are used. Specifically, the distances d1 and d2 between the outer and inner elements 118 and 119 along the X direction is measured for each of the marks 111 and 113. Then, the difference (d1–d2) of the distances d1 and d2 is calculated. Thus, the alignment accuracy along the X direction is determined by the value of the difference (d1–d2) thus calculated.

Similarly, the alignment accuracy along the Y direction is measured using the alignment marks 110 and 112 located on the longitudinal axis 115. Specifically, the distances d3 and d4 between the outer and inner elements 118 and 119 along the Y direction is measured for each of the marks 110 and 112. Then, the difference (d3–d4) of the distances d3 and d4 is calculated. Thus, the alignment accuracy along the Y direction is determined by the value of the difference (d3–d4) thus calculated.

Actually, a lot of the rectangular exposure areas 107 shown in FIG. 3, each of which includes the conventional alignment mark set comprising the four marks 110, 111, 112, and 113, are regularly arranged on the semiconductor wafer 121, as shown in FIG. 4. In FIG. 4, the exposure areas 107 are arranged in a matrix array on the wafer 121. Needless to say, the alignment accuracy is measured in each of the areas 107 using the marks 110, 111, 112, and 113.

With the conventional alignment mark set comprising the four marks 110, 111, 112, and 113, some of the marks 110, 111, 112, and 113 are located close to each other. For example, as shown in FIG. 4, the mark 111 in one of the areas 107 and the mark 113 in another of the areas 107, which are surrounded by an ellipse 116, are close to each other. Also, the mark 112 in one of the areas 107 and the mark 110 in another of the areas 107, which are surrounded by an ellipse 117, are close to each other. In this case, there arises a problem that the inner elements 119 of the marks 110, 111, 112, and 113 do not have desired contours or edges, which is explained in detail below with reference to FIG. 5.

For example, with the inner element 119 of the alignment mark 111 surrounded by the ellipse 116, the outer side face **119*b* tends to be tilted, as shown in FIG. 5. The reason why the outer side face 119*b*** is made oblique is not known clearly; however, it is thought in the following way.

Specifically, it is assumed that the exposing light irradiated to the resist layer for the inner element 119 of the mark 111 is affected by the next mark 113 to the mark 111. Thus, the resist layer is not exposed to the light as desired. As a result, the top corner of the side face 119 is broken or deformed in the development process of the resist layer.

If the element 119 has the oblique side face **119*b* shown in FIG. 5, the contour or outline of the side face 119*b* is unable to be detected or observed correctly. Thus, the distance d2 between the side face 119*b* and the opposing inner face 118*b* of the outer element 118** tends to be measured d2'. As a consequence, the alignment accuracy thus observed tends to include some divergence or error of [(d1–d2')/2], which degrades the measurement accuracy.

Moreover, there is a possibility that the inner element 119 of the mark 110, 111, 112, or 113 is deformed due to applied etching action and/or applied heat in a subsequent process or processes. In this case, because of synergism of the deformation and the tilting/breaking of the side face **119*b***, the measurement accuracy deteriorates more.

SUMMARY OF THE INVENTION

Accordingly, an object of the present invention is to provide an alignment mark set that facilitates the formation of a desired contour of each alignment mark, and a method of measuring alignment of patterns using the set.

Another object of the present invention is to provide an alignment mark set that suppresses the degradation of measurement accuracy for alignment of patterns, and a method of measuring alignment of patterns using the set.

Still another object of the present invention is to provide an alignment mark set that ensures high measurement accuracy, and a method of measuring alignment of patterns using the set.

The above objects together with others not specifically mentioned will become clear to those skilled in the art from the following description.

According to a first aspect of the present invention, an alignment mark set is provided. The set comprises:

(a) a first alignment mark formed in an exposure area; the area having a periphery, first central axis, and a second central axis perpendicular to the first axis; the first alignment mark being located near the first central axis and apart from the second axis;

(b) a second alignment mark formed in the exposure area; the second alignment mark being located near the second central axis and apart from the first axis; and (c) when the exposure areas are regularly arranged in such a way as to have a same orientation in a plane, each of the first and second alignment marks in one of the sets is not located close to the first and second alignment marks in another of the sets, thereby ensuring irradiation of exposing light to all the areas.

With the alignment mark set according to the first aspect of the present invention, the first alignment mark is formed in the exposure area in such a way as to be located near the first axis of the area and apart from the second axis thereof. On the other hand, the second alignment mark is formed in the exposure area in such a way as to be located near the second axis of the area and apart from the first axis thereof.

Thus, when the alignment mark sets according to the first aspect are arranged to be adjacent to each other in a plane on use, each of the first and second alignment marks in one of the set is not located close to the first and second alignment marks in another of the sets. Accordingly, even if exposing light is irradiated to all the exposure areas thus arranged, none of the first and second alignment marks in one of the sets are affected by the first and second marks in another of the sets.

As a result, the formation of a desired contour of each of the first and second marks is facilitated, which suppresses the degradation of measurement accuracy for alignment of patterns. This means that high measurement accuracy is ensured.

It is preferred that each of the first and second marks is square.

In a preferred embodiment of the alignment mark set according to the first aspect, there are additionally provided with;

(c) a third alignment mark formed in the exposure area; the third alignment mark being located near the first central axis and apart from the second axis; the third alignment mark being shifted from the first central axis along the second central axis in an opposite direction to the first alignment mark; and (d) a fourth alignment mark formed in the exposure area; the fourth alignment mark being located near the second central axis and apart from the first axis; the fourth alignment mark being shifted from the second central axis along the first central axis in an opposite direction to the second alignment mark.

In another preferred embodiment of the alignment mark set according to the first aspect, there are additionally provided with;

(c) a third alignment mark formed in the exposure area; the third alignment mark being located near the first central axis and apart from the second axis;

the third alignment mark being located on the first central axis along with the first alignment mark; and (d) a fourth alignment mark formed in the exposure area; the fourth alignment mark being located near the second central axis and apart from the first axis; the fourth alignment mark being located on the second central axis along with the second alignment mark.

In this embodiment, it is preferred that the first and third marks are apart from the periphery on opposite sides at equal distances while the second and fourth marks are apart from the periphery on opposite sides at equal distances. More preferably, the first and third marks are apart from the periphery at equal distances of 100 $\mu$m or greater while the second and fourth marks are apart from the periphery at equal distances of 100 $\mu$m or greater.

According to a second aspect of the present invention, a method of measuring alignment of patterns is provided, where alignment mark sets are regularly arranged in such a way as to have a same orientation in a plane on use. This method comprises the steps of:

(a) arranging the alignment mark sets on the plane so as to be adjacent to each other;
each of the sets comprising (a-1) a first alignment mark formed in an exposure area; the area having a periphery, first central axis, and a second central axis perpendicular to the first axis; the first alignment mark being located on the first axis near the periphery;

(a-2) a second alignment mark formed in the exposure area; the second alignment mark being located on the second axis near the periphery;

(a-3) a third alignment mark formed in the exposure area; the third alignment mark being located on the first axis near the periphery on an opposite side to the first mark;

(a-4) a fourth alignment mark formed in the exposure area; the fourth alignment mark being located on the second axis near the periphery on an opposite side to the second mark; and (b) measuring alignment accuracy using the first mark in a first one of the sets and the third mark in a second one of the sets adjacent to the first one of the sets and the second mark in one of the first one of the sets and the fourth mark in the second one of the sets;
wherein unopposed sides of the first and third marks located on opposite sides to each other with respect to the periphery of the area and unopposed sides of the second and fourth marks located on opposite sides to each other with respect to the periphery of the area are used for measuring.

With the method according to the second aspect of the invention, unopposed sides of the first and third marks located on opposite sides to each other with respect to the periphery of the area and unopposed sides of the second and fourth marks located on opposite sides to each other with respect to the periphery of the area are used for measuring. Thus, even if exposing light is irradiated to all the exposure areas thus arranged, none of the first and second alignment marks in one of the sets are affected by the first and second marks in another of the sets.

As a result, the formation of a desired contour of each of the first and second marks is facilitated, which suppresses the degradation of measurement accuracy for alignment of patterns. This means that high measurement accuracy is ensured.

It is preferred that each of the first and second marks is square.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
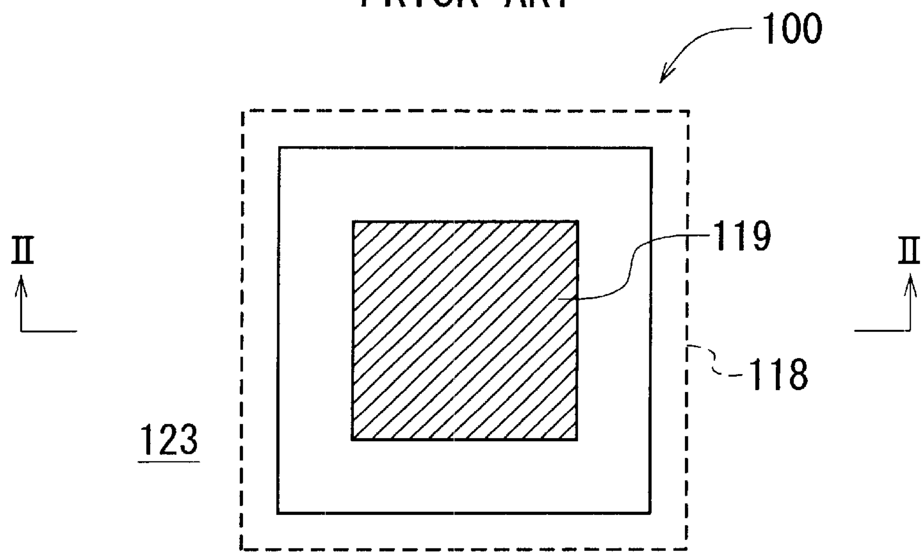
FIG. 1 is a schematic plan view of a conventional alignment mark set, which is formed on a semiconductor substrate or wafer.
Figure 2:
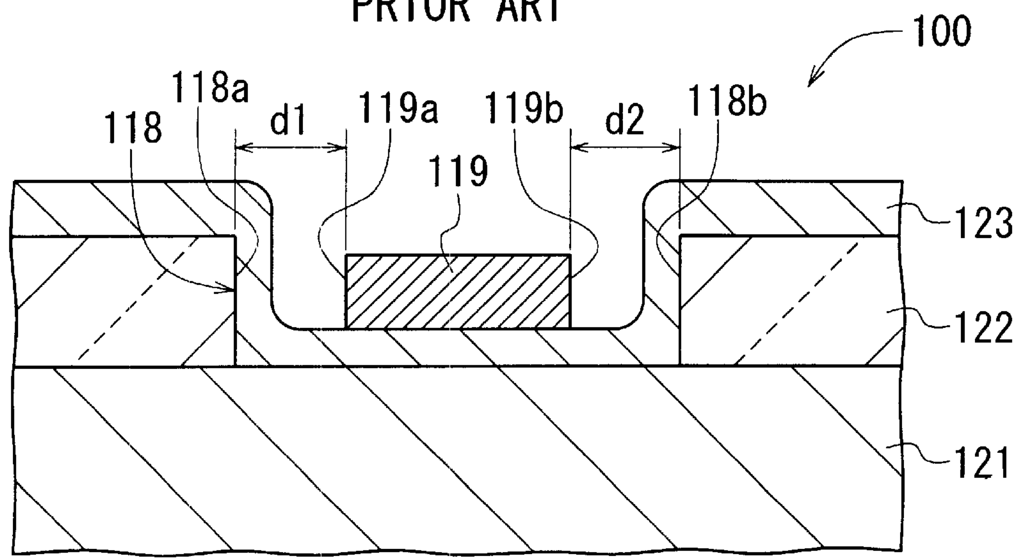
FIG. 2 is a schematic cross-sectional view of the conventional alignment mark set shown in FIG. 1, which is taken along the line II—II in FIG. 1.

Preferred embodiments of the present invention will be described in detail below while referring to the drawings attached.

FIRST EMBODIMENT

Figure 8:
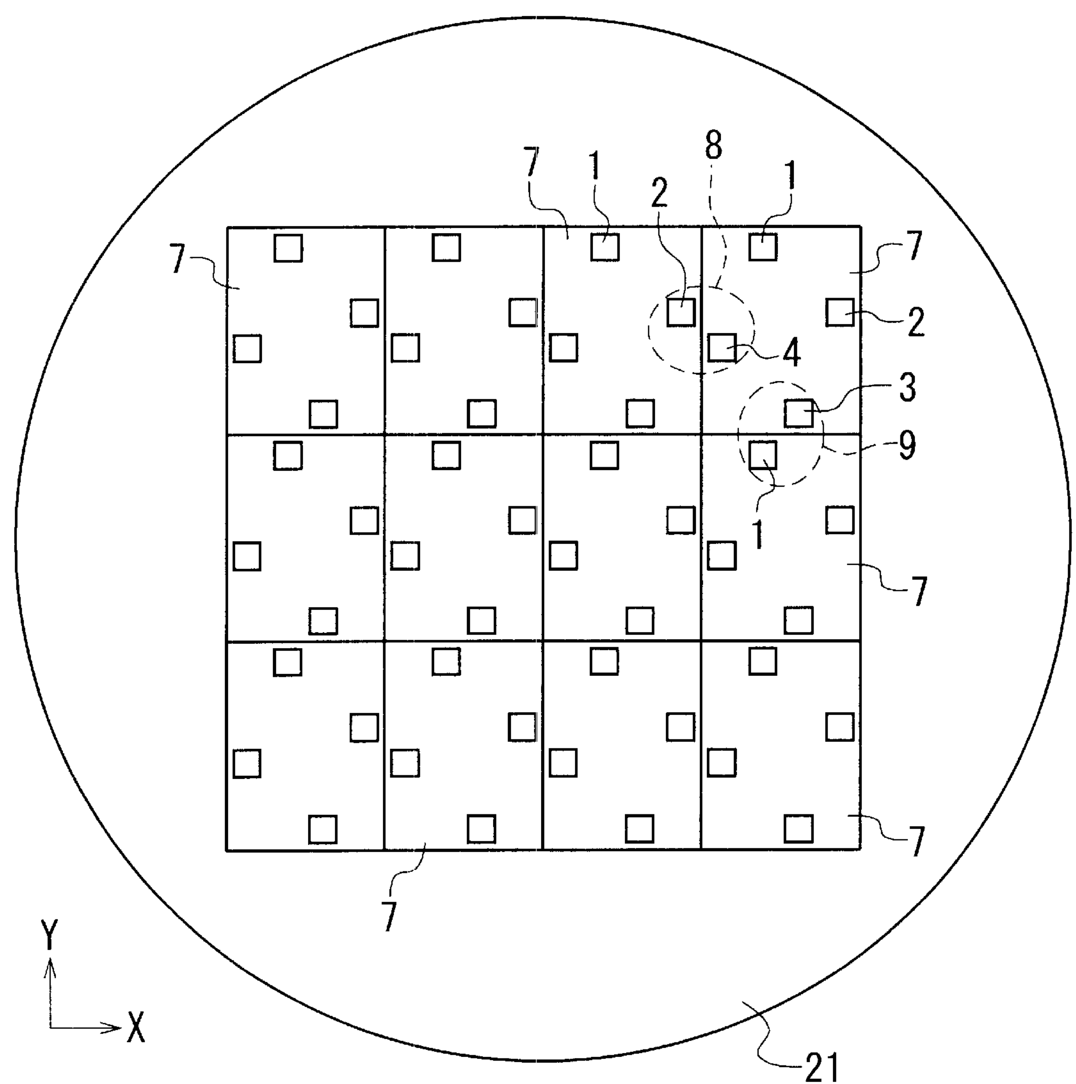
FIG. 8 is a schematic plan view showing the layout of the alignment mark sets according to the first embodiment of FIG. 6 on a semiconductor wafer.

As shown in FIG. 8, a lot of rectangular exposure areas 7 are regularly formed or defined on a semiconductor wafer 21; in other words, the areas 7 are arranged in a matrix array on the wafer 21. In each of the areas 7, an alignment mark set according to a first embodiment of the invention is formed, which comprises four alignment marks 1, 2, 3, and 4, as shown in FIG. 6.

Figure 6:
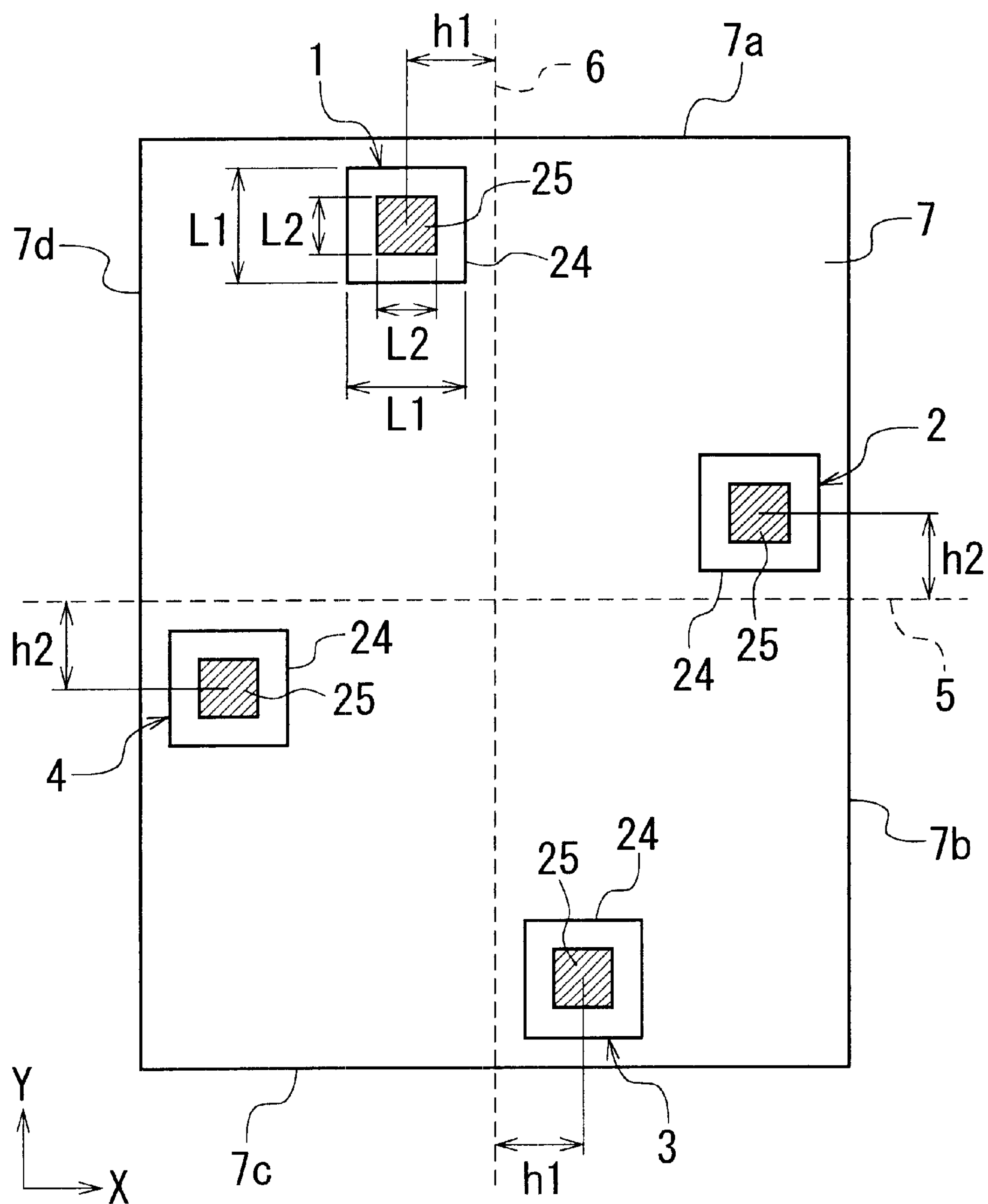
FIG. 6 is a schematic plan view showing the layout of alignment marks in an alignment mark set according to a first embodiment of the invention, which are formed in an exposure area on a semiconductor wafer.

The four alignment marks 1, 2, 3, and 4 are arranged in such a manner as shown in FIG. 6. Specifically, the two marks 1 and 3 are located near the longitudinal, central axis 6 of the rectangular exposure area 7, where the direction along the axis 6 is defined as the Y direction. The mark 1 is near the upper short side 7*a* of the area 7 while the mark 3 is near the lower short side 7*c* thereof. The mark 1 is shifted (i.e., offset) from the axis 6 toward the left-hand side in FIG. 6 by a distance h1. The mark 3 is shifted (i.e., offset) from the axis 6 toward the right-hand side in FIG. 6 by the same distance h1. Thus, it is said that the marks 1 and 3 are shifted from the axis 6 in opposite directions. The distance h1 is measured from the axis 6 to the center of the mark 1 or 3.

On the other hand, the remaining two marks 2 and 4 are located near the lateral, central axis 5 of the rectangular exposure area 7, where the direction along the axis 5 is defined as the X direction. The mark 2 is near the right long side 7*b* of the area 7 while the mark 4 is near the left long side 7*d* thereof. The mark 2 is shifted (i.e., offset) from the axis 5 upward in FIG. 6 by a distance h2. The mark 4 is shifted (i.e., offset) from the axis 5 downward in FIG. 6 by the same distance h2. Thus, it is said that the marks 2 and 4 are shifted from the axis 5 in opposite directions. The distance h2 is measured from the axis 5 to the center of the mark 2 or 4.

All the marks 1, 2, 3, and 4 are the same in shape and structure and therefore, the shape and structure of the mark 1 is explained in detail below.

As shown in FIG. 6, the mark 1 comprises a square outer element 24 and a square inner element 25. The inner element 25 is entirely located in the outer element 24 so as to be concentric with the outer element 24. Each of the four sides of the inner element 25 (the length of which is L2) is parallel to a corresponding one of the four sides of the outer element 24 (the length of which is L1), where L1>L2.

The offset distance h1 of the mark 1 or 3 is determined in such a way as to be larger than half of the side length L1 of the mark 1 or 3, i.e., h1>[(L)/2]. Thus, the marks 1 and 3 are located apart from the longitudinal, central axis 6.

The offset distance h2 of the mark 2 or 4 is determined in such a way as to be larger than half of the side length L1 of the mark 2 or 4, i.e., h2>[(L1)/2]. Thus, the marks 2 and 4 are located apart from the lateral, central axis 5.

Figure 9:
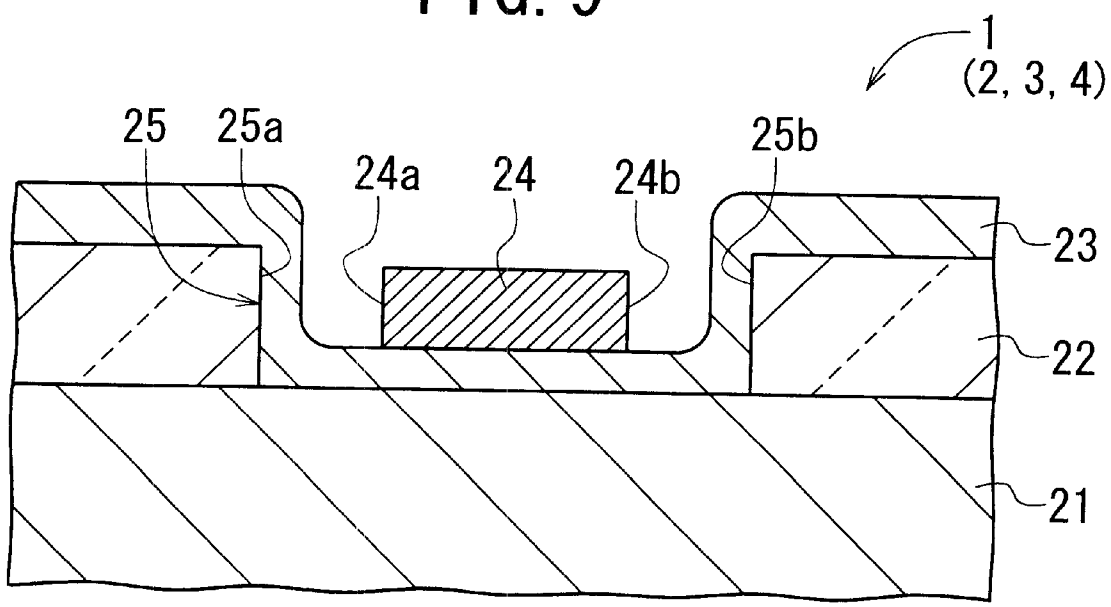
FIG. 9 is a schematic cross-sectional view of the alignment mark of the set according to the first embodiment of FIG. 6, which is taken along a line like the line II—II in FIG. 1.

FIG. 9 shows a cross-sectional view showing the structure of the mark 1, which is taken along a line like the line II—II in FIG. 1. The other marks 2, 3, and 4 have the same cross-section as shown in FIG. 9. The mark 1 is formed in the following way.

First, a first layer 22 is formed on the surface of the semiconductor wafer 21. Next, a resist layer (not shown) is formed on the first layer 22 and is patterned to have a specific shape by the lithography technique. Thereafter, using the patterned resist layer as a mask, the underlying first layer 22 is selectively etched, thereby forming a first or lower circuit pattern (not shown) and the outer square element 25 of the alignment mark 1 in the layer 22. As clearly seen from FIG. 9, the element 25 is a square hole formed in the layer 22.

Subsequently, a second layer 23 is formed on the first layer 22 thus patterned so as to contact the bottom and side faces of the element 25 (i.e., the hole of the first layer 22). Then, a resist layer (not shown) is formed on the second layer 23 and is patterned by the lithography technique, thereby forming a second or upper circuit pattern (not shown) and the inner square element 24 of the alignment mark 1 on the layer 23 in the hole 25 of the layer 22. As clearly seen from FIG. 6, the inner element 24 is a square part of the resist layer and located in the hole or outer element 25. The patterned resist layer thus formed is used as a mask in the next etching process for the second layer 23.

The alignment mark set comprising the marks 1, 2, 3, and 4 according to the first embodiment is used to measure the alignment accuracy between the first circuit pattern formed by the first layer 22 and the second circuit pattern formed by the patterned resist layer. In this case, the relative positional relationship between the inner and outer elements 24 and 25 is measured.

Figure 7:
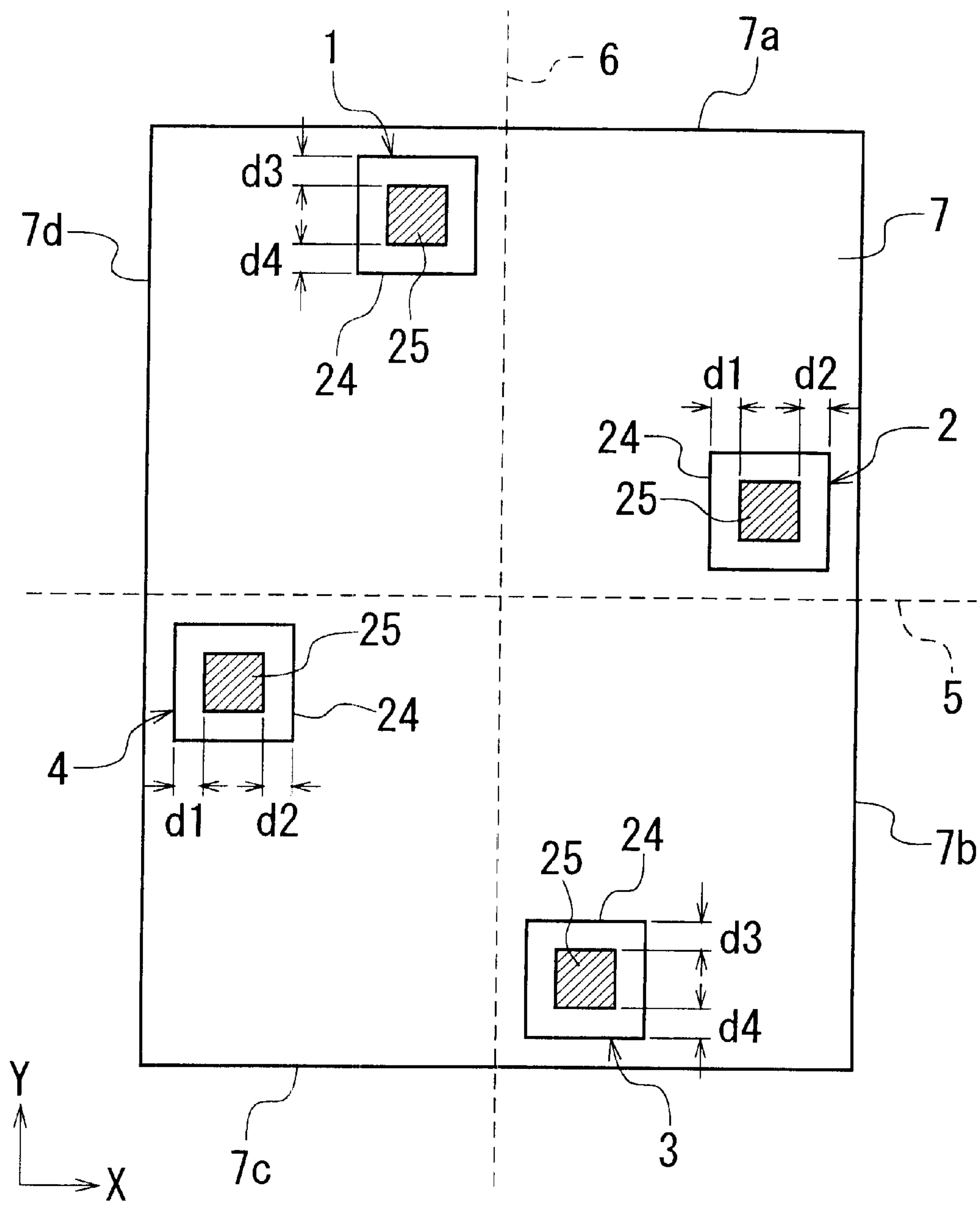
FIG. 7 is a schematic plan view showing a method of measuring alignment accuracy in the exposure area with the alignment mark set according to the first embodiment of FIG. 6.

For example, as shown in FIGS. 7 and 9, the distance d1 between the inner side face 25*a* of the outer element 25 and the facing side face 24*a* of the inner element 24 is measured. At the same time, the distance d2 between the opposite inner side face 25*b* of the outer element 25 and the facing side face 24*b* of the inner element 24 is measured. If the values of the distances d1 and d2 are equal, it is judged that the first or lower circuit pattern is overlaid with the second or upper circuit pattern correctly (i.e., with desired alignment accuracy). Sometimes, it is judged whether or not the value difference (d1–d2) between the distances d1 and d2 is within a specific range. Thus, the alignment accuracy in the X direction is obtained.

Similarly, the distance d3 between the inner side face of the outer element 25 and the facing side face of the inner element 24 is measured. At the same time, the distance d4 between the opposite inner side face of the outer element 25 and the facing side face of the inner element 24 is measured. If the values of the distances d3 and d4 are equal, it is judged that the first or lower circuit pattern is overlaid with the second or upper circuit pattern correctly (i.e., with desired alignment accuracy). Sometimes, it is judged whether or not the value difference (d3–d4) between the distances d3 and d4 is within a specific range. Thus, the alignment accuracy in the Y direction is obtained.

No subsequent process is applied unless the first or lower circuit pattern is overlaid with the second or upper circuit pattern with desired alignment accuracy.

The distances d1, d2, d3, and d4 are measured by the known laser-scanning method or image-processing method with a known suitable apparatus.

With the alignment mark set according to the first embodiment of FIG. 6, as explained above, the two marks 1 and 3 are respectively located in the vicinity of the short sides 7*a* and 7*c* of the rectangular exposure area 7 in such a way as to be shifted by the same distance h1 in the opposite directions with respect to the longitudinal, central axis 6. Similarly, the remaining two marks 2 and 4 are respectively located in the vicinity of the long sides 7*b* and 7*d* of the area 7 in such a way as to be shifted by the same distance h2 in the opposite directions with respect to the lateral, central axis 5.

Accordingly, when a lot of the exposure areas 7 each including the alignment mark set of the first embodiment are arranged in a matrix array, as shown in FIG. 8, none of the alignment marks 1, 2, 3, and 4 belonging in the two adjoining exposure areas 7 are located close to each other. For example, as shown in FIG. 8, the marks 1 and 3 surrounded by an ellipse 9 are shifted in opposite directions (i.e., downward and upward) along the common short side of the adjoining areas 7. This means that these marks 1 and 3 are sufficiently apart from each other; in other words, none of these marks 1 and 3 apply any bad effect to each other due to exposing light used in the lithography process for patterning the resist layer on the second layer 23.

Similarly, the remaining two marks 2 and 4 surrounded by an ellipse 8 are shifted in opposite directions (i.e., toward left and right sides) along the common long side of the adjoining areas 7. This means that these marks 2 and 4 are sufficiently apart from each other; in other words, none of these marks 2 and 4 apply any bad effect to each other due to the same exposing light.

As a result, unlike the previously-explained conventional alignment mark set, no breaking or deformation of the square inner element 25 occurs at its side face and desired shape and/or contour can be easily formed. Thus, the contour of the side faces of the inner element 25 can be detected correctly, decreasing the measurement error and raising the measurement accuracy. This leads to improvement of fabrication yield of semiconductor devices.

SECOND EMBODIMENT

Figure 10:
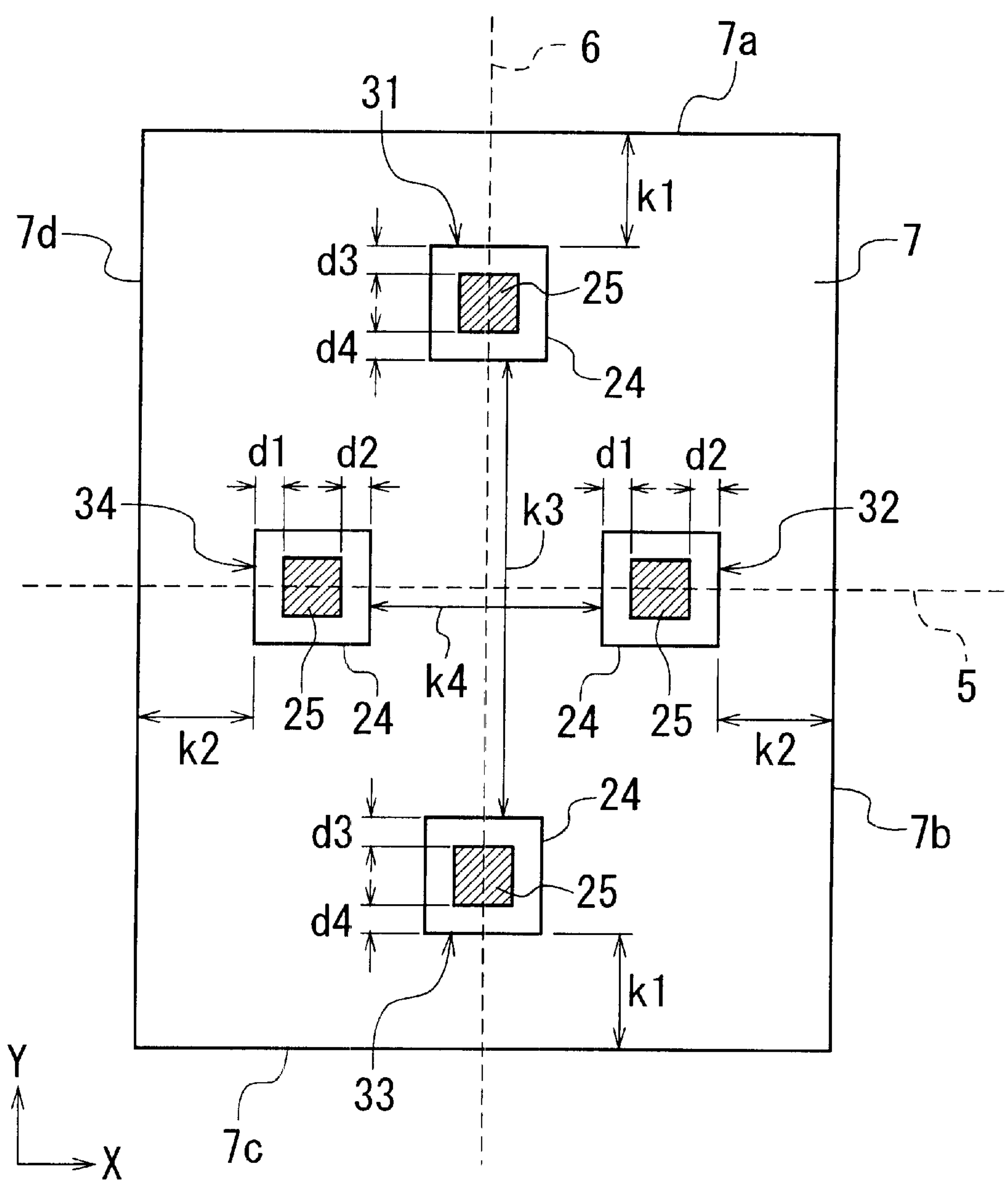
FIG. 10 is a schematic plan view showing a method of measuring alignment accuracy in the exposure area with an alignment mark set according to a second embodiment of the invention.

FIG. 10 shows an alignment mark set according to a second embodiment of the invention, which comprises four square alignment marks 31, 32, 33, and 34. This alignment mark set is formed in each of the rectangular exposure areas 7 arranged in a matrix array on the wafer 21, which has been referred in the first embodiment.

With the alignment mark set according to the second embodiment shown in FIG. 10, the alignment marks 31, 32, 33, and 34 are formed in the following way:

As shown in FIG. 10, unlike the first embodiment, both the marks 31 and 33 are located on the longitudinal central axis 6 of the rectangular exposure area 7. In other words, these two marks 31 and 33 have no offset. Also, the mark 31 is apart from the upper short side 7*a* of the area 7 at a distance k1 while the mark 33 is apart from the lower short side 7*c* thereof at the same distance k1. The distance k1 is measured from the short side 7*a* or 7*c* to the opposing side of the mark 31 or 33. The marks 31 and 33 are apart from each other at a distance k3 along the axis 6, which is measured between the opposing sides of the marks 31 and 33 in the Y direction.

Preferably, the distance k1 is equal to or more than 50 $\mu$m. More preferably, the distance k1 is equal to or more than 100 $\mu$m. The distance k3 between the opposing sides of the marks 31 and 33 is set to be 100 $\mu$m or more.

On the other hand, both the marks 32 and 34 are located on the lateral, central axis 5 of the rectangular exposure area 7. In other words, the marks 32 and 34 have no offset. Also, the mark 32 is apart from the right long side 7*b* of the area 7 at a distance k2 while the mark 34 is apart from the left long side 7*c* thereof at the same distance k2. The distance k2 is measured from the long side 7*b* or 7*d* of the area 7 to the opposing side of the mark 32 or 34. The marks 32 and 34 are apart from each other at a distance k4 along the axis 5, which is measured between the opposing sides of the marks 32 and 34 in the X direction.

Preferably, the distance k2 is equal to or more than 50 $\mu$m. More preferably, the distance k2 is equal to or more than 100 $\mu$m. The distance k4 between the opposing sides of the marks 32 and 34 is set to be 100 $\mu$m or more.

Since the four marks 31, 32, 33, and 34 are arranged in the area 7 in such a manner as above, they are located at the shifted positions toward the center of the area 7 (i.e., the intersection of the axes 5 and 6) compared with the conventional alignment mark set comprising the marks 110, 111, 112, and 113 and the alignment mark set comprising the marks 1, 2, 3, and 4 according to the first embodiment.

All the marks 31, 32, 33, and 34 are the same in shape and structure as the marks 1, 2, 3, and 4 of the first embodiment.

The alignment mark set comprising the marks 31, 32, 33, and 34 according to the second embodiment is used to measure the alignment accuracy between the first circuit pattern formed by the first layer 22 and the second circuit pattern. In this case, the relative positional relationship between the elements 24 and 25 is measured.

For example, as shown in FIG. 10, the distances d1 between the outer and inner elements 24 and 25 of the marks 32 and 34 are measured while the distances d2 between the outer and inner elements 24 and 25 of the marks 31 and 33 are measured. Thus, the alignment accuracy in the Y direction is obtained. Similarly, the distances d3 between the outer and inner elements 24 and 25 of the marks 31 and 33 are measured while the distances d4 between the inner and outer elements 24 and 25 are measured. Thus, the alignment accuracy in the X direction is obtained. According to the value of the difference (d1–d2) and the value of the difference (d3–d4), i.e., the alignment accuracy in the Y and X directions, it is judged whether or not the first or lower circuit pattern is overlaid with the second or upper circuit pattern correctly (i.e., with desired alignment accuracy).

With the alignment mark set according to the second embodiment of FIG. 10, the marks 31 and 33 are respectively located on the axis 6 at the positions shifted toward the center of the exposure area 7 in such a way as to be at the same distance k1 from the short sides 7*a* and 7*c* of the area 7. Similarly, the marks 32 and 34 are respectively located on the axis 5 at the positions shifted toward the center of the area 7 in such a way as to be at the same distance k2 from the long sides 7*b* and 7*d* thereof.

Figure 11:
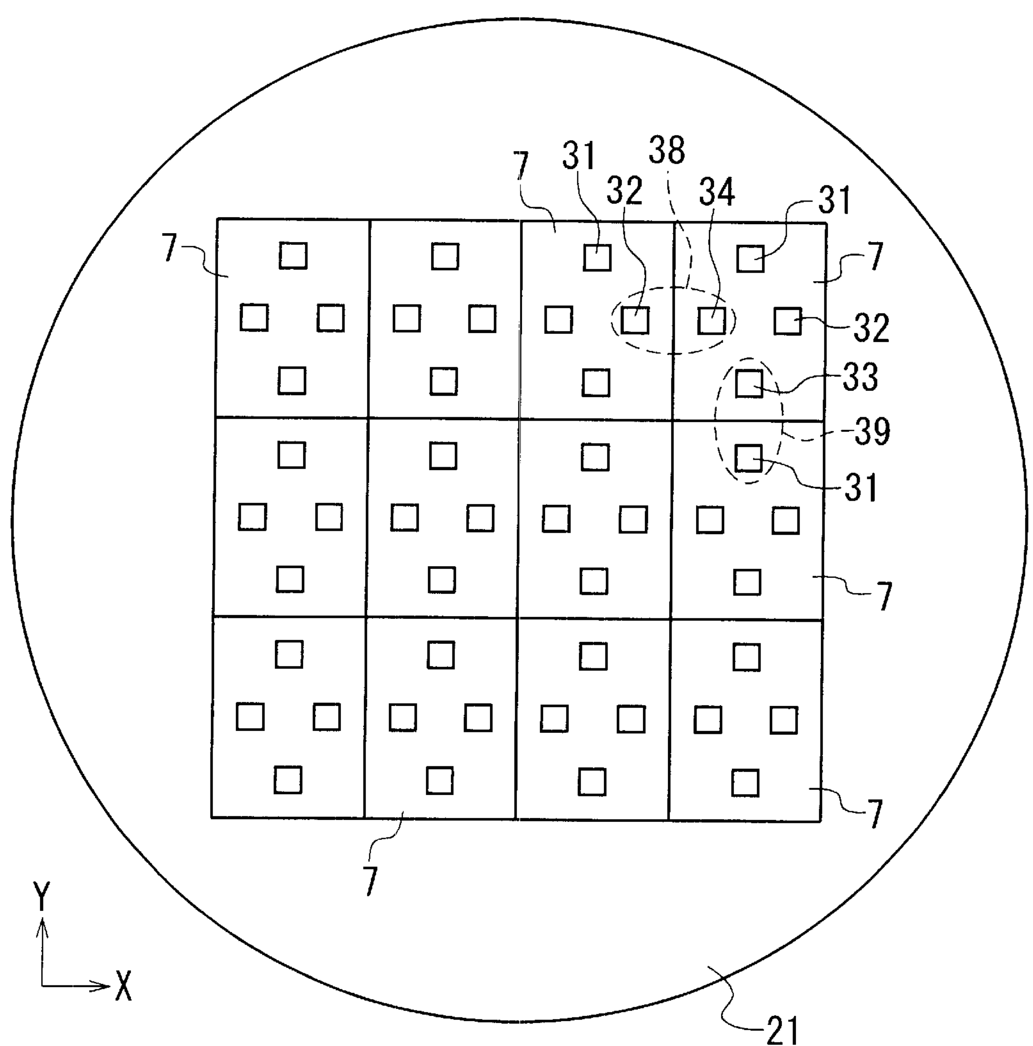
FIG. 11 is a schematic plan view showing the layout of the alignment mark sets according to the second embodiment of FIG. 10, which are formed in each of the exposure areas on a semiconductor wafer.

Accordingly, when a lot of the exposure areas 7 each having the alignment mark set of the second embodiment are arranged in a matrix array, as shown in FIG. 11, all the alignment marks 31, 32, 33, and 34 in the two adjoining exposure areas 7 are arranged at sufficient long distances to each other. For example, as shown in FIG. 11, the marks 31 and 33 surrounded by the ellipse 39 are shifted in opposite directions along the common long side of the adjoining areas 7. This means that the marks 31 and 33 are sufficiently apart from each other; in other words, none of these marks 31 and 33 apply any bad effect to each other due to the exposing light.

Similarly, the marks 32 and 34 surrounded by the ellipse 38 are shifted in opposite directions along the common short side of the adjoining areas 7. This means that the marks 32 and 34 are sufficiently apart from each other; in other words, none of these marks 32 and 34 apply any bad effect to each other due to the exposing light.

As a result, like the first embodiment, no breaking or deformation of the inner element 25 occurs at its side face and desired shape and/or contour can be formed. Thus, the contour of the side faces of the inner element 25 can be detected correctly, decreasing the measurement error and raising the measurement accuracy.

THIRD EMBODIMENT

Figure 12:
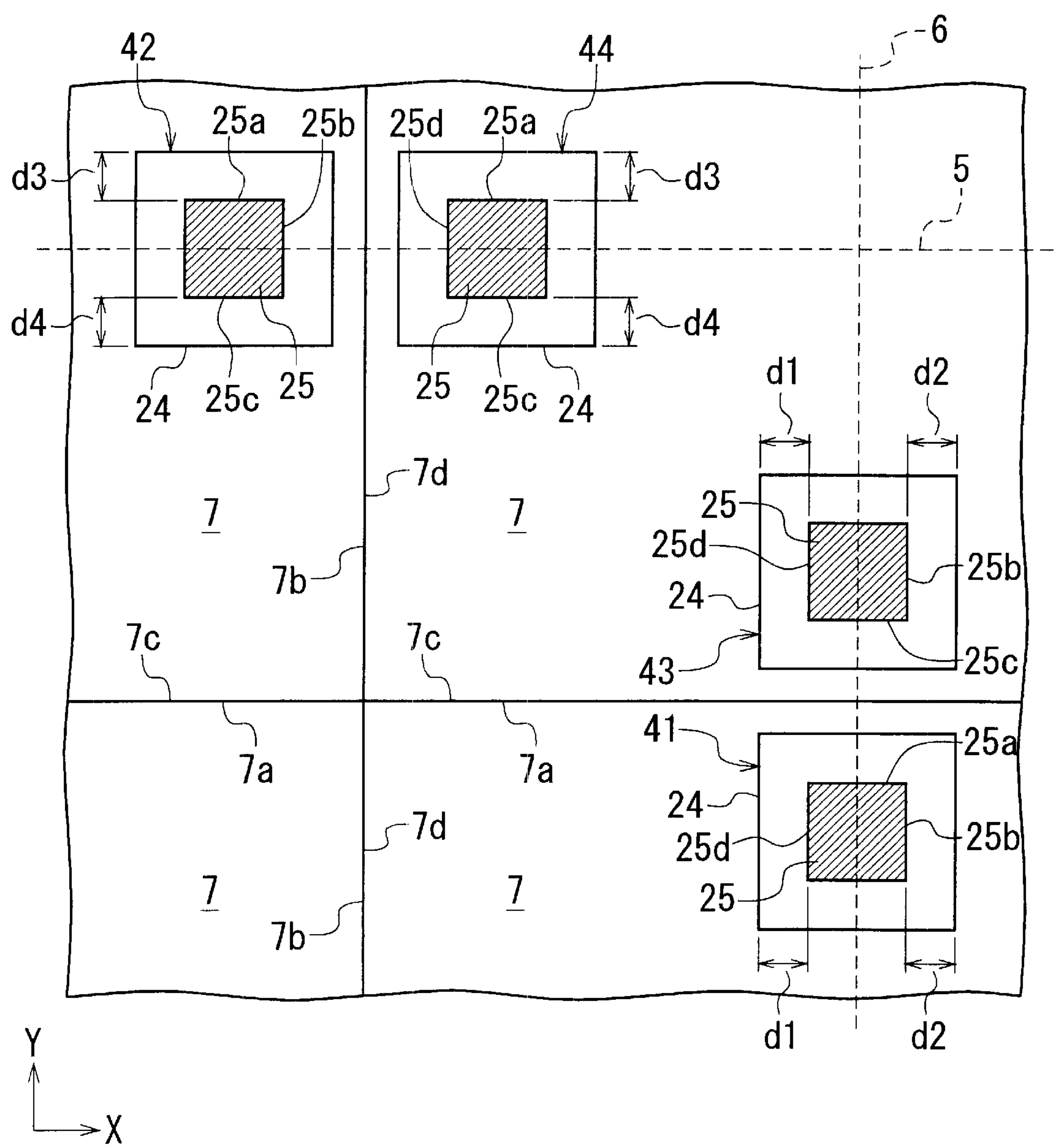
FIG. 12 is a schematic plan view showing the layout of alignment mark sets according to a third embodiment of the invention, which are formed in each of the exposure areas on a semiconductor wafer.

FIG. 12 shows an alignment mark set used in a method of measuring alignment accuracy according to a third embodiment of the invention. This set is formed in each of the rectangular exposure areas 7 arranged in a matrix array on the wafer 21, which has been referred in the first embodiment. This set comprises four alignment marks 41, 42, 43, and 44.

As shown in FIG. 12, like the second embodiment, both the marks 41 and 43 are located on the longitudinal, central axis 6 of the rectangular exposure area 7. In other words, the marks 41 and 43 have no offset with respect to the axis 6. Also, the mark 41 is close to the upper short side 7*a* of the area 7 at a distance while the mark 43 is close to the lower short side 7*c* thereof at the same distance.

On the other hand, both the marks 42 and 44 are located on the lateral, central axis 5 of the area 7. In other words, the marks 42 and 44 have no offset with respect to the axis 5. Also, the mark 42 is close to the right long side 7*b* of the area 7 at a distance while the mark 44 is apart from the left long side 7*c* thereof at the same distance.

All the marks 41, 42, 43, and 44 are the same in shape and structure as the marks 1, 2, 3, and 4 of the first embodiment.

Next, the method of measuring the alignment accuracy according to the third embodiment is explained below, in which the alignment mark set comprising the marks 41, 42, 43, and 44 is used. To measure the alignment accuracy in the X-direction, as shown in FIG. 12, the marks 41 and 43 aligned on the axis 6 (not the marks 42 and 44 aligned on the axis 5) are used. Specifically, the distance d1 between the inner side face of the outer element 24 of the mark 41 and the facing side face 25*d* of the inner element 25 thereof is measured. At the same time, the distance d2 between the opposite inner side face of the outer element 24 of the mark 41 and the facing side face 25*b* of the inner element 25 thereof is measured. Similarly, the distance d1 between the inner side face of the outer element 24 of the mark 43 and the facing side face 25*d* of the inner element 25 thereof is measured. At the same time, the distance d2 between the opposite inner side face of the outer element 24 of the mark 43 and the facing side face 25*b* of the inner element 25 thereof is measured.

According to the value of the difference (d1–d2) of the marks 41 and 43, it is judged whether or not the first or lower circuit pattern is overlaid with the second or upper circuit pattern with desired alignment accuracy in the X direction.

To measure the alignment accuracy in the Y-direction, the marks 42 and 44 aligned on the axis 5 (not the marks 41 and 43 aligned on the axis 6) are used. Specifically, the distance d3 between the inner side face of the outer element 24 of the mark 42 and the facing side face 25*a* of the inner element 25 thereof is measured. At the same time, the distance d4 between the opposite inner side face of the outer element 24 of the mark 42 and the facing side face 25*c* of the inner element 25 thereof is measured. Similarly, the distance d3 between the inner side face of the outer element 24 of the mark 44 and the facing side face 25*d* of the inner element 25 thereof is measured. At the same time, the distance d4 between the opposite inner side face of the outer element 24 of the mark 44 and the facing side face 25*b* of the inner element 25 thereof is measured.

According to the value of the difference (d3–d4) of the marks 42 and 44, it is judged whether or not the first or lower circuit pattern is overlaid with the second or upper circuit pattern with desired alignment accuracy in the Y direction.

Figure 3:
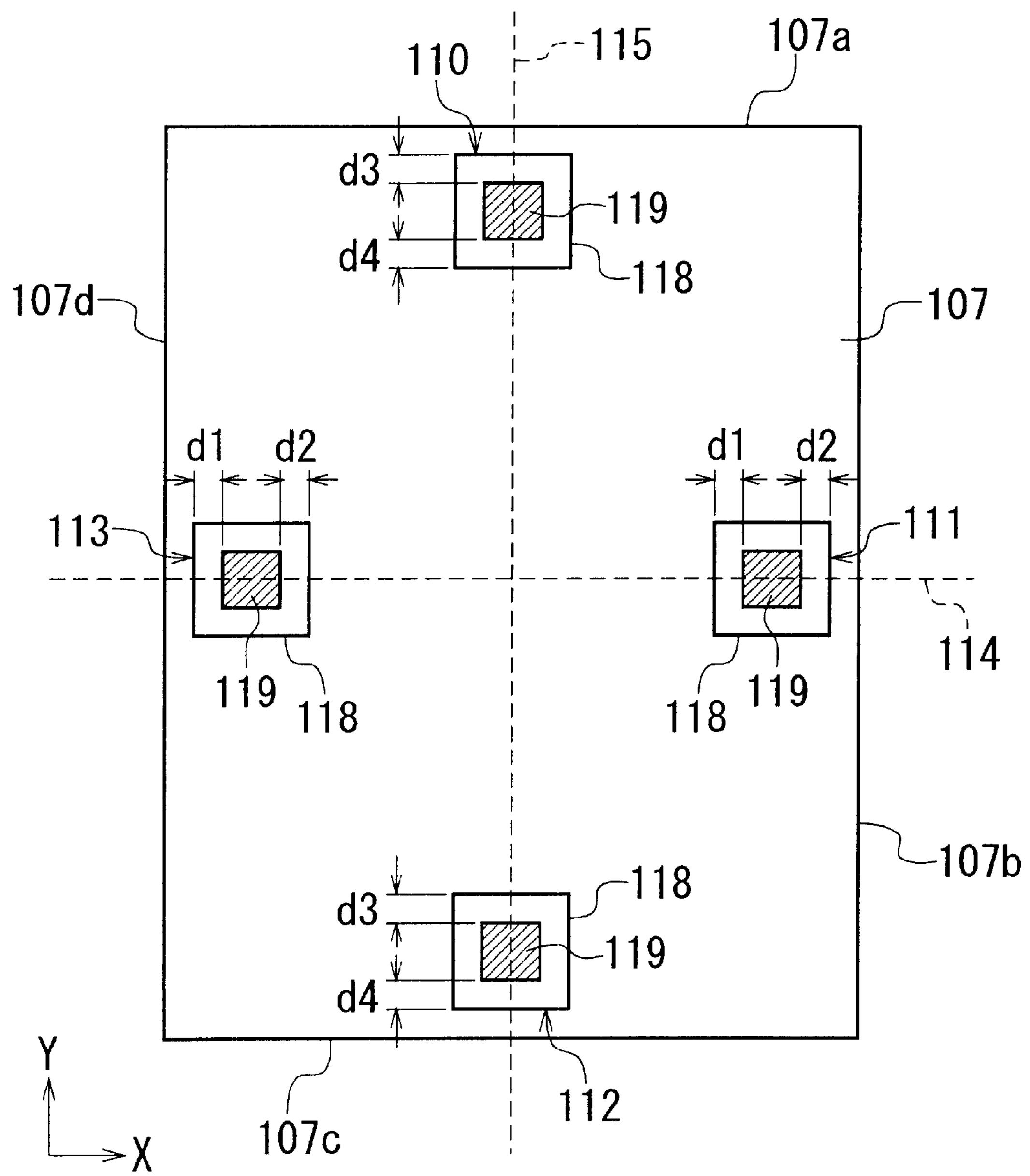
FIG. 3 is a schematic plan view showing the layout of the alignment marks in the conventional set shown in FIGS. 1 and 2, which are formed in a rectangular exposure area on a semiconductor wafer.
Figure 4:
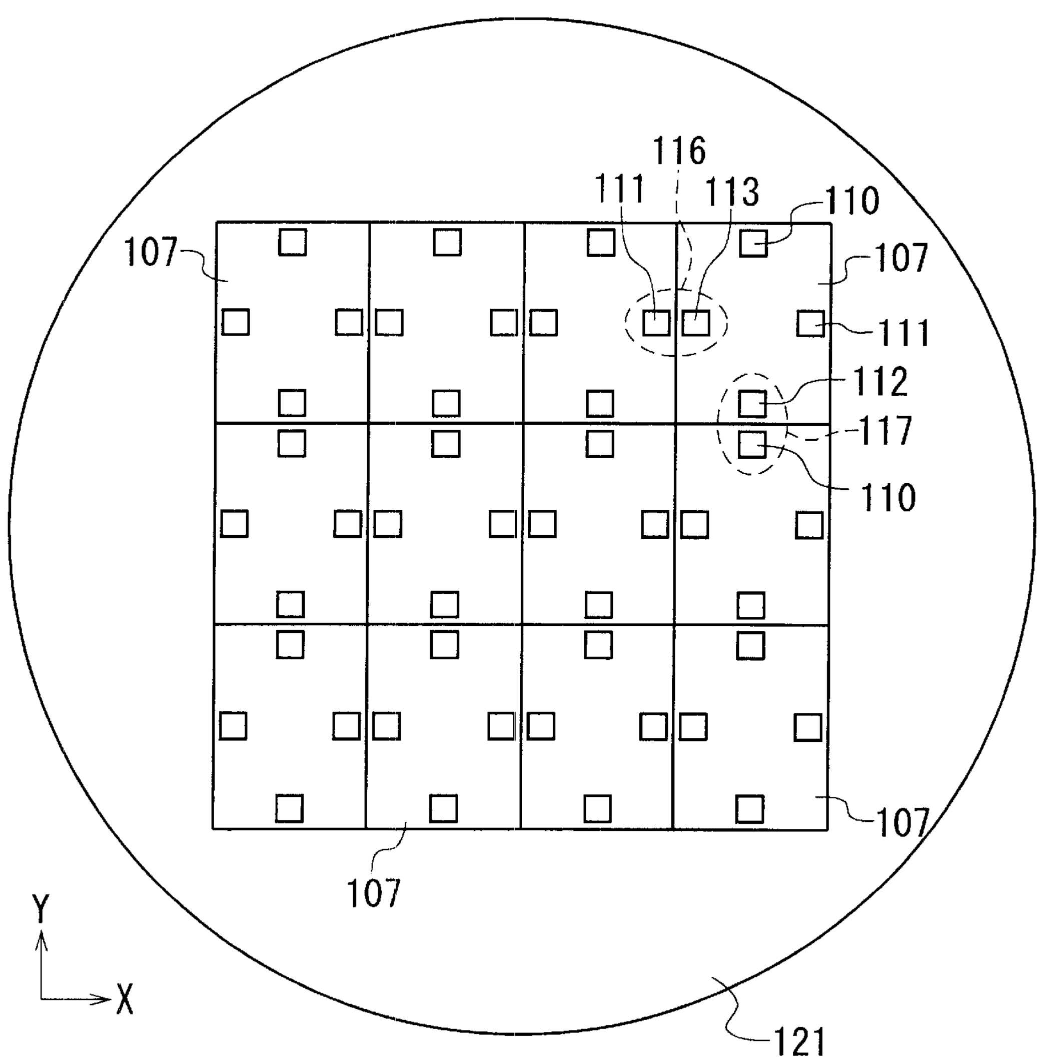
FIG. 4 is a schematic plan view showing the layout of the conventional alignment mark sets shown in FIGS. 1 to 3 on a semiconductor wafer.
Figure 5:
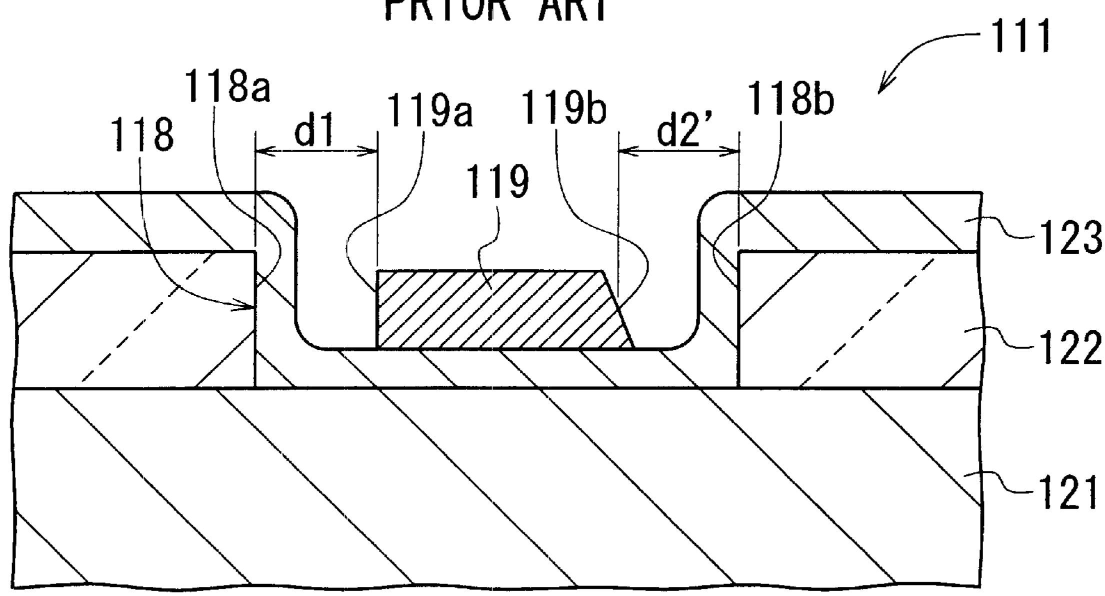
FIG. 5 is a schematic cross-sectional view of the conventional alignment mark set shown in FIG. 1 taken along the line II—II in FIG. 1, which schematically shows the unwanted oblique side face of the inner element of the mark.

As seen from FIG. 12, the marks 41 and 43 are aligned in the Y direction and close to each other while the marks 42 and 44 are aligned in the x direction and close to each other. Thus, similar to the conventional method of measuring alignment accuracy as explained with reference to FIGS. 3 and 4, there is a possibility that breaking or deformation occurs at the side face 25*a* of the inner element 25 of the mark 41, at the side face 25*c* of the inner element 25 of the mark 43, at the side face 25*b* of the inner element 25 of the mark 42, and at the side face 25*d* of the inner element 25 of the mark 44.

However, as explained above, the broken or deformed faces 25*a* and 25*c* of the marks 41 and 43 are not used (i.e., the faces 25*b* and 25*d* of the marks 41 and 43 are used) to measure the Y-direction accuracy. Also, the broken or deformed faces 25*b* and 25*d* of the marks 42 and 44 are not used (i.e., the faces 25*a* and 25*c* of the marks 42 and 44 are used) to measure the X-direction accuracy. Thus, there is almost no possibility that the measurement accuracy degrades. In other words, the alignment can be measured with higher accuracy than the conventional method.

With the above-described method according to the third embodiment, the alignment mark set is approximately the same in structure as the conventional mark set. However, it is needless to say that any alignment mark set (including the sets according to the first and second embodiments) may be used for the method of the third embodiment.

In the above-described first to third embodiments, the inner and outer elements 25 and 24 of every alignment mark in the exposure area 7 are square. This is to facilitate the alignment measuring operation with a measuring apparatus. However, the invention is not limited to these cases. It is needless to say that the elements 25 and 24 may have any other shape according to the necessity.

Moreover, in the above-described first to third embodiments, the alignment mark set comprises four alignment marks in each exposure area. This is to facilitate the alignment measuring operation with a measuring apparatus and to simplify the pattern for the alignment mark set. However, the invention is not limited to this case. It is sufficient for the set to include at least two alignment marks. Needless to say, the set may comprise five or more alignment marks in each exposure area.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. An alignment mark set in an exposure area comprising:

(a) a first alignment mark formed in the exposure area;
  the area having a periphery, first central axis, and a second central axis perpendicular to the first axis;
  the first alignment mark being located near the first central axis and apart from the second axis;

(b) a second alignment mark formed in the exposure area;
  the second alignment mark being located near the second central axis and apart from the first axis; and (c) when a plurality of exposure areas are regularly arranged in such a way as to have a same orientation in a plane, each set of the first and second alignment marks in one of the exposure areas is not located close to a set of first and second alignment marks in another of the exposure areas, thereby ensuring irradiation of exposing light to all the exposure areas.

2. The set according to claim 1, wherein each of the first and second marks is square.

3. The set according to claim 1, further comprising:

(c) a third alignment mark formed in the exposure area;
  the third alignment mark being located near the first central axis and apart from the second axis;
  the third alignment mark being shifted from the first central axis along the second central axis in an opposite direction to the first alignment mark; and (d) a fourth alignment mark formed in the exposure area;
- the fourth alignment mark being located near the second central axis and apart from the first axis;
- the fourth alignment mark being shifted from the second central axis along the first central axis in an opposite direction to the second alignment mark.

4. The set according to claim 1, further comprising:

(c) a third alignment mark formed in the exposure area;
- the third alignment mark being located on the first central axis along with the first alignment mark and apart from the second axis;
- the third alignment mark being located near the first alignment mark; and (d) a fourth alignment mark formed in the exposure area;
- the fourth alignment mark being located on the second central axis along with the second alignment mark and apart from the first axis;
- the fourth alignment mark being located near the second alignment mark.

5. The set according to claim 4, wherein the first and third marks are apart from the periphery on opposite sides at equal distances while the second and fourth marks are apart from the periphery on opposite sides at equal distances.

6. The set according to claim 4, wherein the first and third marks are apart from the periphery at equal distances of 100 $\mu$m or greater while the second and fourth marks are apart from the periphery at equal distances of 100 $\mu$m or greater.

* * * * *